(12) United States Patent
Mizutani et al.

(10) Patent No.: US 11,139,144 B2
(45) Date of Patent: Oct. 5, 2021

(54) CHARGED PARTICLE BEAM APPARATUS

(71) Applicant: Hitachi High-Tech Corporation, Tokyo (JP)

(72) Inventors: Shunsuke Mizutani, Tokyo (JP); Shahedul Hoque, Tokyo (JP); Uki Ikeda, Tokyo (JP); Makoto Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/482,765

(22) PCT Filed: Mar. 24, 2017

(86) PCT No.: PCT/JP2017/011908
§ 371 (c)(1),
(2) Date: Aug. 1, 2019

(87) PCT Pub. No.: WO2018/173242
PCT Pub. Date: Sep. 27, 2018

(65) Prior Publication Data
US 2019/0355552 A1 Nov. 21, 2019

(51) Int. Cl.
*H01J 37/244* (2006.01)
*H01J 37/28* (2006.01)
*H01J 37/147* (2006.01)

(52) U.S. Cl.
CPC .......... *H01J 37/28* (2013.01); *H01J 37/1474* (2013.01); *H01J 37/244* (2013.01); *H01J 2237/2443* (2013.01); *H01J 2237/24475* (2013.01)

(58) Field of Classification Search
CPC ...... H01J 37/28; H01J 37/1474; H01J 47/244; H01J 2237/1415
See application file for complete search history.

(56) References Cited

U.S. PATENT DOCUMENTS 5,644,132 A * 7/1997 Litman .................. H01J 37/244
                                                        250/310
5,872,358 A   2/1999 Todokoro et al.
(Continued)

FOREIGN PATENT DOCUMENTS

DE  10 2013 006 535 A1  10/2014
DE  11 2011 103 373 B4   8/2017
(Continued)

OTHER PUBLICATIONS

International Search Report (PCT/ISA/210) issued in PCT Application No. PCT/JP2017/011908 dated Jul. 25, 2017 with English translation (seven (7) pages).
(Continued)

*Primary Examiner* — Wyatt A Stoffa
(74) *Attorney, Agent, or Firm* — Crowell & Moring LLP (57) ABSTRACT

The present invention provides a charged particle beam apparatus that covers a wide range of detection angles of charged particles emitted from a sample. Accordingly, the present invention proposes a charged particle beam apparatus that is provided with an objective lens for converging charged particle beams emitted from a charged particle source, and a detector for detecting charged particles emitted from a sample, wherein: the objective lens includes an inner magnetic path and an outer magnetic path which are formed so as to enclose a coil; the inner magnetic path comprises a first inner magnetic path disposed at a position opposite to an optical axis of the charged particle beams and a second inner magnetic path which is formed at a slant with respect to the optical axis of the charged particle beams and which includes a leading end of the magnetic path; and a detection surface of the detector is disposed at the outer side from a virtual straight line that passes through the leading end of the
(Continued)

magnetic path and that is parallel to the optical axis of the charged particle beams.

16 Claims, 8 Drawing Sheets

(56) References Cited

U.S. PATENT DOCUMENTS

| | | | |
|---|---|---|---|
| 6,037,589 A | 3/2000 | Yonezawa et al. | |
| 6,555,819 B1 | 4/2003 | Suzuki et al. | |
| 6,600,156 B2* | 7/2003 | Kazumori | H01J 37/141 |
| | | | 250/310 |
| 9,029,766 B2* | 5/2015 | Morishita | H01J 37/244 |
| | | | 250/310 |
| 2001/0011702 A1* | 8/2001 | Yonezawa | H01J 37/28 |
| | | | 250/283 |
| 2002/0079449 A1* | 6/2002 | Krijn | H01J 37/28 |
| | | | 250/310 |
| 2003/0230714 A1* | 12/2003 | Yonezawa | H01J 37/10 |
| | | | 250/310 |
| 2004/0113074 A1* | 6/2004 | Suzuki | H01J 37/28 |
| | | | 250/310 |
| 2007/0187598 A1* | 8/2007 | Tachibana | H01J 37/28 |
| | | | 250/310 |
| 2008/0191135 A1* | 8/2008 | Aoki | G01N 23/225 |
| | | | 250/311 |
| 2008/0315094 A1* | 12/2008 | Wang | H01J 37/244 |
| | | | 250/310 |
| 2009/0090866 A1* | 4/2009 | Zhang | H01J 37/244 |
| | | | 250/361 R |
| 2009/0200463 A1* | 8/2009 | Degenhardt | H01J 37/244 |
| | | | 250/307 |
| 2011/0215241 A1* | 9/2011 | Wang | G01N 23/00 |
| | | | 250/307 |
| 2012/0025074 A1 | 2/2012 | Barbi et al. | |
| 2012/0280126 A1* | 11/2012 | Fukuda | G01N 23/225 |
| | | | 250/310 |
| 2012/0298864 A1* | 11/2012 | Morishita | H01J 49/067 |
| | | | 250/310 |
| 2013/0187055 A1 | 7/2013 | Zadrazil et al. | |
| 2014/0306110 A1 | 10/2014 | Schubert | |
| 2014/0361167 A1* | 12/2014 | Morishita | H01J 37/28 |
| | | | 250/310 |
| 2015/0214002 A1* | 7/2015 | Imamura | H01J 37/244 |
| | | | 250/310 |
| 2015/0221471 A1 | 8/2015 | Hatano et al. | |
| 2017/0069459 A1* | 3/2017 | Cheifetz | H01J 37/244 |
| 2019/0259571 A1* | 8/2019 | Cheifetz | H01J 37/226 |

FOREIGN PATENT DOCUMENTS

| | | |
|---|---|---|
| DE | 11 2012 003 413 B4 | 10/2017 |
| JP | 9-171791 A | 6/1997 |
| JP | 2001-110351 A | 4/2001 |
| JP | 2003-331770 A | 11/2003 |
| JP | 2004-259469 A | 9/2004 |
| JP | 2008-198471 A | 8/2008 |
| JP | 2013-58314 A | 3/2013 |
| JP | 2013-541799 A | 11/2013 |
| JP | 2015-146283 A | 8/2015 |
| JP | 5860642 B2 | 2/2016 |
| WO | WO 2007/119873 A1 | 10/2007 |

OTHER PUBLICATIONS

Japanese-language Written Opinion (PCT/ISA/237) issued in PCT Application No. PCT/JP2017/011908 dated Jul. 25, 2017 (six (6) pages).
German-language Office Action issued in German Application No. 11 2017 006 802.9 dated Feb. 25, 2020 with English translation (12 pages).
Japanese-language Office Action issued in Japanese Application No. 2020-126129 dated Jul. 20, 2021 (seven (7) pages).

* cited by examiner

CHARGED PARTICLE BEAM APPARATUS

TECHNICAL FIELD

The present invention relates to a charged particle beam apparatus that detects charged particles emitted from a sample by irradiating the sample with the charged particle beams, and particularly relates to a charged particle beam apparatus that detects charged particles emitted in a certain relative angle direction with respect to a charged particle beam optical axis.

BACKGROUND ART

A scanning electron microscope, which is an aspect of a charged particle beam apparatus, is an apparatus that generates an image or a signal waveform based on detection of secondary electrons or the like obtained by irradiating a sample with electron beams. It is known that reflected electrons (backscattered electrons) in electrons emitted from the sample is suitable for observing an unevenness of the sample for having an angular dependence of being emitted in a specular reflection direction of an incident angle to a sample surface. PTL 1 discloses a scanning electron microscope in which reflected electrons emitted in a small angle (low angle) direction with respect to a sample surface are guided onto an objective lens by using a leakage magnetic field of the objective lens causing a converged magnetic field to leak toward the sample, and are detected by a detector disposed on the trajectory. In addition, PTL 2 discloses a scanning electron microscope in which an acceleration tube for temporarily accelerating electron beams is provided in a beam path of an objective lens, and a reflected electron detector is installed in the acceleration tube. PTL 2 describes a method of discriminating secondary electrons and reflected electrons using a phenomenon that there is a difference between a convergence effect with respect to the reflected electrons and a convergence effect with respect to the secondary electrons of the objective lens.

PRIOR ART LITERATURE

Patent Literature

PTL 1: JP-A-2001-110351 (Corresponding to U.S. Pat. No. 6,555,819)

PTL 2: Japanese Patent No. 5860642 (Corresponding to U.S. Pat. No. 9,029,766)

SUMMARY OF INVENTION

Technical Problem

The reflected electrons are generally less in amount than the secondary electrons, and there may be no sufficient signal amount to perform an observation, a measurement, or an inspection with high accuracy. Although it is conceivable to increase the irradiation time of the electron beams and the probe current in order to secure a sufficient signal amount, it is desirable to increase a detection amount while maintaining a low dose because a time required for the observation or the like and a charge amount based on the beam irradiation increase. Therefore, it is desirable to detect not only low-angle reflected electrons, but also medium-angle reflected electrons having a relatively large amount.

A certain amount of low-angle reflected electrons can be detected by introducing the reflected electrons to the detector disposed on the objective lens by the leakage magnetic field of the objective lens as described in PTL 1; however, a range of detection angles that can be covered is limited in such a configuration. In order to detect the reflected electrons emitted in a wide angle range (low angle to medium angle) with high efficiency, it is necessary to make the detection surface larger or provide the detection surface closer to a beam irradiation position where the reflected electrons are emitted; however, high efficiency detection is limited in the configuration disclosed in PTL 1. In addition, since the detection surface of the detector is provided in the acceleration tube for accelerating the electron beams, the upsizing of the detection surface is limited in PTL 2. In particular, the size of the detection surface is smaller than an inner diameter of a leading end part of an inner magnetic path of the objective lens, and high-angle reflected electrons close to an primary electron beam optical axis are detected; however, the efficiency for detecting the low-angle and medium-angle reflected electrons with broadened trajectories is decreased. In addition, since a hole is configured in the magnetic path, parasitic aberration and processing accuracy variations of the objective lens are generated, and high resolution is hindered.

A charged particle beam apparatus that covers a wide range of detection angles of charged particles emitted from a sample is proposed below.

Solution to Problem

As an aspect for achieving the above object, a charged particle beam apparatus is proposed, which includes: an objective lens that is configured to converge charged particle beams emitted from a charged particle source; and a detector that is configured to detect charged particles emitted from a sample, in which the objective lens includes an inner magnetic path and an outer magnetic path that are formed so as to enclose a coil, the inner magnetic path includes a first inner magnetic path that is disposed at a position opposite to an optical axis of the charged particle beams, and a second inner magnetic path that is formed at a slant with respect to the optical axis of the charged particle beams and includes a leading end of the magnetic path, and a detection surface of the detector is disposed at the outer side from a virtual straight line that passes through the leading end of the magnetic path and is parallel to the optical axis of the charged particle beams.

Advantageous Effect

According to the above configuration, the charged particles emitted from the sample can be detected with high efficiency over a wide range from a low angle to a medium angle.

DESCRIPTION OF EMBODIMENTS

An application of a scanning electron microscope, which is a type of a charged particle beam apparatus, is for evaluation and measurement of a semiconductor device. In recent years, the structure of semiconductor devices becomes finer and 3D thereof is in progress, and evaluation values required by customers who are semiconductor device makers are diversified. In particular, as 3D of the device structure, there is a need to measure a bottom dimension of a hole or a trench shape on a semiconductor substrate with high accuracy in order to improve a yield.

When a sample is irradiated with electron beams, signal electrons having various energies are emitted in various directions by the interaction between electrons and the sample. The signal electrons have different information about the sample according to an emission energy and an emission angle, and discriminative detection for the signal electrons is essential for various measurements.

In general, signal electrons are distinguished from each other in that, signal electrons emitted at an energy of 50 eV or less are called secondary electrons, and signal electrons emitted at an energy larger than 50 eV and close to the energy of the primary electron beam are called reflected electrons. The secondary electrons are sensitive to a surface shape and an electric potential of the sample and are effective in measuring the dimension of a surface structure such as a pattern width of the semiconductor device structure, but for 3D structures such as holes and trenches, the secondary electrons cannot escape from the holes and trenches because they are absorbed by a side wall, and thus detection and measurement cannot be performed. On the other hand, the reflected electrons contain information about a composition and a stereoscopic shape of the sample, information about a 3D structure and a difference in compositions between a surface and a bottom can be obtained, and high energy is obtained, so that the reflected electrons can escape from the holes and trenches by penetrating through the side wall and thus can be used for detection and measurement for signals from the bottom of the hole and trench structure.

In the following description, the optical axis direction of the electron beams is defined as 90 degrees with respect to the emission angle of electrons emitted from the sample. According to the emission angle of the reflected electrons, reflected electrons emitted at about 90 degrees are defined as high-angle reflected electrons, reflected electrons emitted at about 45 degrees are defined as medium-angle reflected electrons, and reflected electrons emitted at about 0 degree are defined as low-angle reflected electrons. The high-angle reflected electrons mainly contain composition information of the sample, the medium-angle reflected electrons contain both composition and shape information of the sample, and the low-angle reflected electrons mainly contain stereoscopic shape information of the sample. In addition, the medium-angle reflected electrons have a feature that the generated number thereof is larger than that of the high-angle reflected electrons and the low-angle reflected electrons.

In the following, a scanning electron microscope that achieves both high resolution and high efficiency will be described even in a case of performing reflected electron detection. More specifically, a scanning electron microscope that enables detection of electrons emitted in a wide range direction from a low-angle to a medium-angle without disposing a detector between an objective lens and a sample will be described in order to minimize a working distance. According to the configuration described in the embodiment to be described later, it is possible to detect medium-angle reflected electrons or low-angle reflected electrons with high efficiency while maintaining high resolution.

In the embodiment described below, for example, a charged particle beam apparatus will be described, which includes a charged particle source that is configured to generate primary charged particle beams (electron beams), a magnetic field objective lens that is configured to converge the charged particle beams on a sample, a deflector that is configured to deflect the primary charged particle beams on the sample, a charged particle detection surface in which a leading end of an inner magnetic path configuring the magnetic field objective lens is inclined with respect to a primary charged particle beam optical axis and charged particles are emitted from the sample on the inner side of the inner magnetic path other than the leading end, and a conversion element that is configured to convert the charged particles into electric signals. An inner diameter of the charged particle detection surface is larger than an inner diameter of the leading end of the inner magnetic path and smaller than an inner diameter of the deflector.

When a part (leading end part) of the inner magnetic path is selectively formed to be inclined, the low-angle and medium-angle reflected electrons emitted from the sample fly without colliding with the inner magnetic path, so that the low-angle and medium-angle reflected electrons can be detected on the charged particle detection surface having an inner diameter larger than the inner diameter of the leading end of the inner magnetic path and not smaller than the inner diameter of the deflector. In addition, objective lens short-focusing is achieved and the charged particles are converted into electric signals on the inner side of the magnetic path, so that it is possible to reduce the size, prevent upsizing of a microscope column and to achieve high resolution at the same time. According to the above configuration, it is possible to achieve both high resolution and high efficiency detection of medium-angle and low-angle reflected electrons.

Hereinafter, an outline of the scanning electron microscope will be described with reference to the drawings.

First Embodiment

Figure 1:
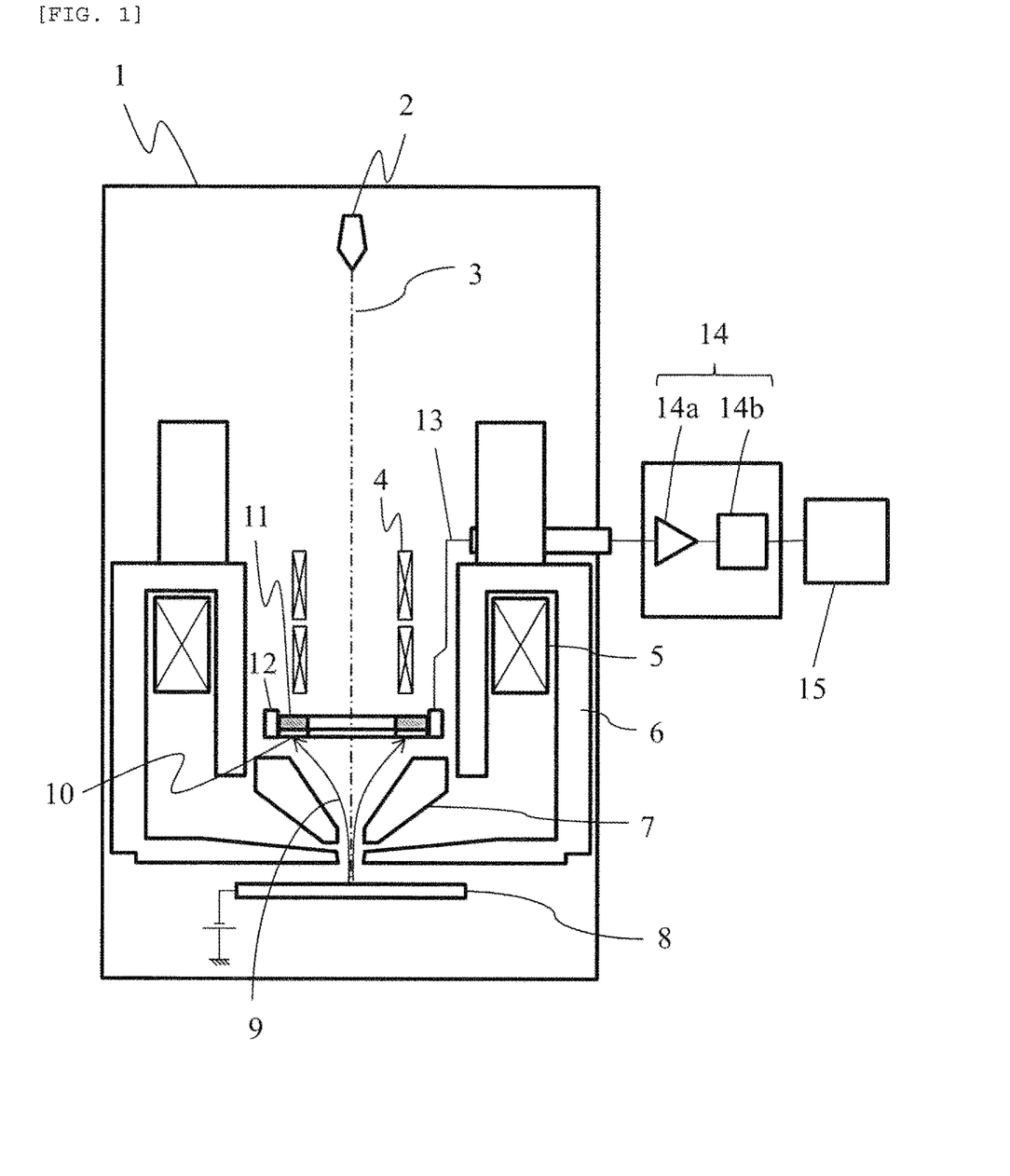
FIG. 1 is a schematic diagram of a scanning electron microscope.

The present embodiment will be described with reference to FIG. 1 to FIG. 4. FIG. 1 is a diagram showing an outline of the scanning electron microscope. An electron source 2 is disposed inside an electron microscope column 1 which is in a vacuum environment, and primary electron beams (electron beams) emitted from the electron source 2 flies along a primary electron beam optical axis 3. The primary electron beams are converged on a sample 8 by an objective lens configured by a coil 5, an outer magnetic path 6 enclosing the coil 5, and an inner magnetic path 7 disposed inclined with respect to the primary electron beam optical axis 3. When a current is applied to the coil, rotationally symmetric magnetic force lines are generated, the magnetic force lines pass through the inner magnetic path and the outer magnetic path, and the magnetic force lines generate a leakage magnetic field at a lens gap (between a leading end of an inner magnetic pole and a leading end of an outer magnetic pole), so that the primary electron beams are converged on the sample by an lens action of the leakage magnetic field.

A negative voltage is applied to the sample 8, and the primary electrons collide with the sample with an energy smaller than the energy generated by the electron source 2. Signal electrons 9 generated from the sample due to the collision of the primary electrons fly in the electron microscope column 1 according to each emission energy and each emission angle. A signal detection surface 10 configured by a scintillator is disposed inside the objective lens, and when the signal electrons 9 collide with the signal detection surface 10, the signal electrons 9 are converted into light by the scintillator, and the light is guided to a photoelectric conversion element 12 by a light guide 11.

The scintillator configuring the signal detection surface 10 may be a single crystal such as YAP or YAG, and may be a powder such as P47, or a GaN-based multilayer thin film structure, as long as it emits light due to the incidence of the charged particle beams. In addition, although FIG. 1 shows a case where the light guide 11 is provided, it is also possible to directly attach the photoelectric conversion element 12 to the scintillator 10 without using the light guide 11. The photoelectric conversion element 12 is configured of, for example, a photomultiplier tube (PMT), a photodiode, or a Si-PM. The guided light is converted into an electric signal by the photoelectric conversion element 12, and the electric signal is transmitted to a signal processing circuit 14 disposed outside the electron microscope column 1 via an output cable 13. The electric signal is amplified into an electric signal having a large amplitude by an amplification circuit 14a on the signal processing circuit 14, the obtained electric signal is processed as a contrast of an image according to the magnitude and frequency of the electric signal per unit time by an arithmetic circuit 14b, and the image is displayed as a pixel with a predetermined gradation value on a monitor 15. The signal electron detection is performed while scanning the sample 8 with the primary electron beams by the deflector 4, and an enlarged two-dimensional image of the sample surface is displayed on the monitor 15.

Figure 2:
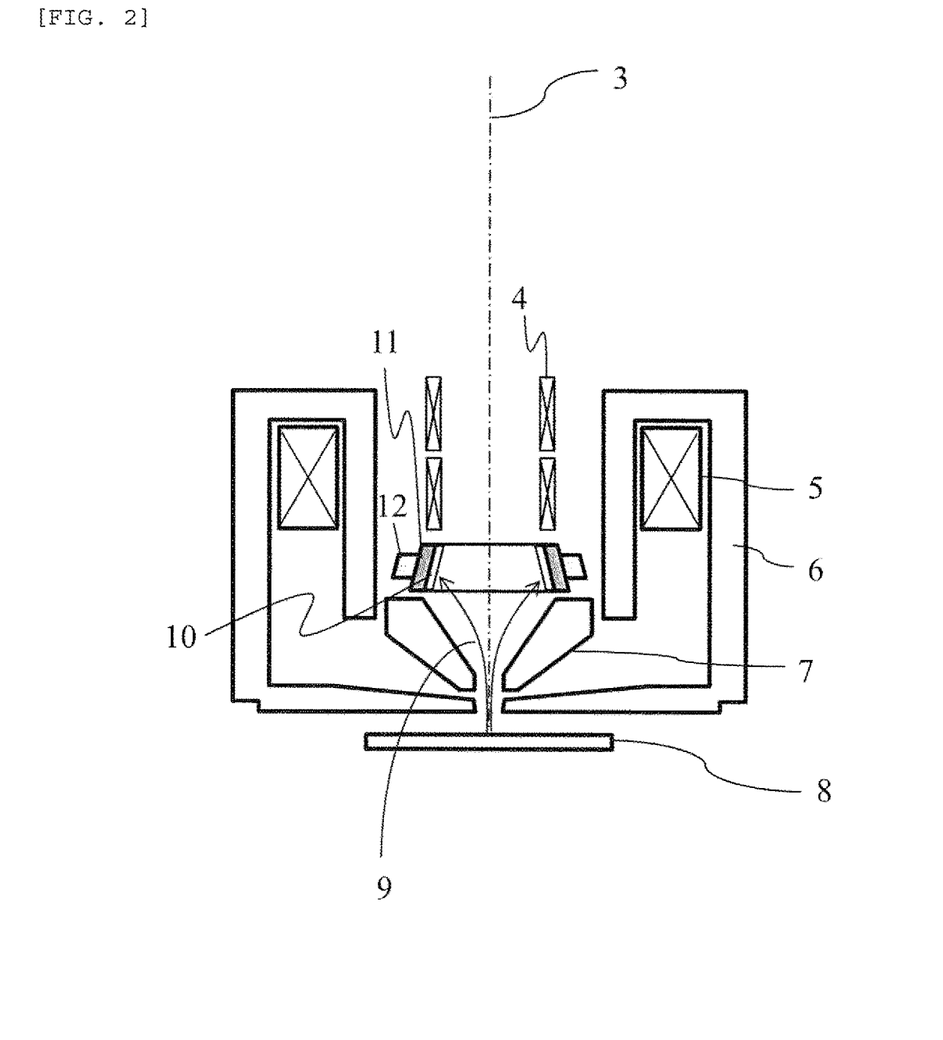
FIG. 2 is a cross-sectional view showing an example of a disposition of a signal detection surface 10.
Figure 3:
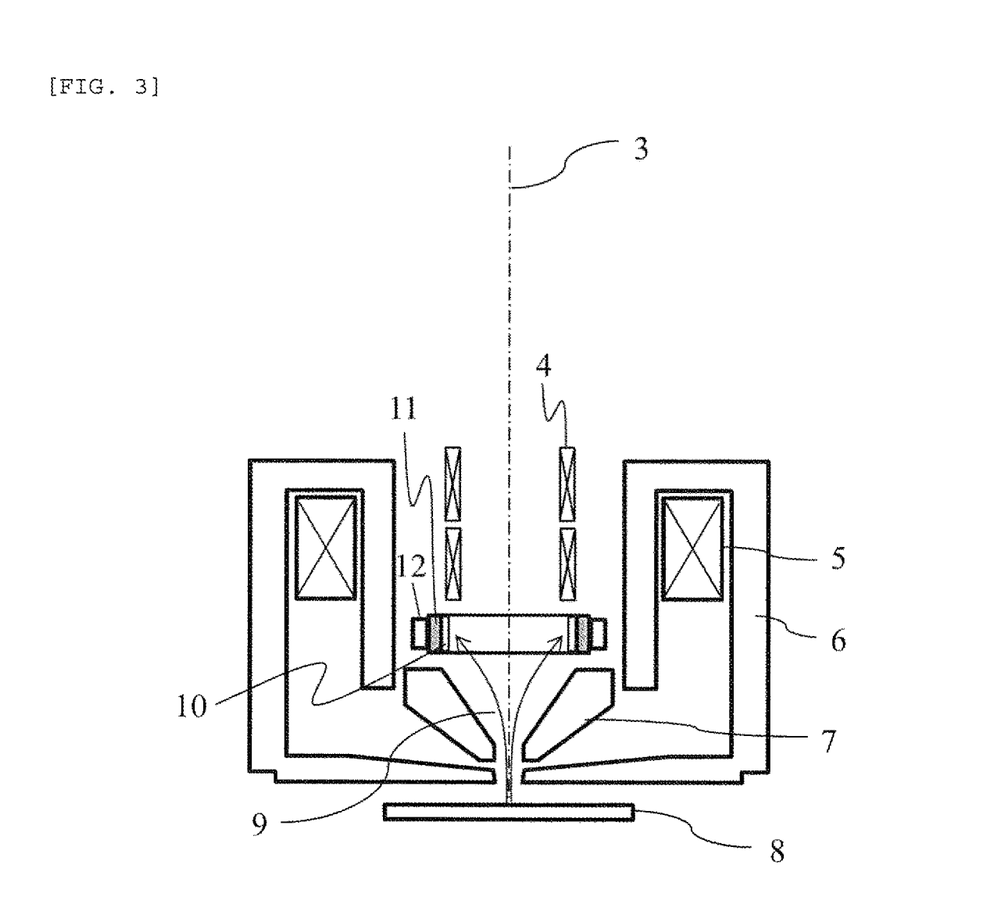
FIG. 3 is a cross-sectional view showing an example of the disposition of the signal detection surface 10.
Figure 4A:
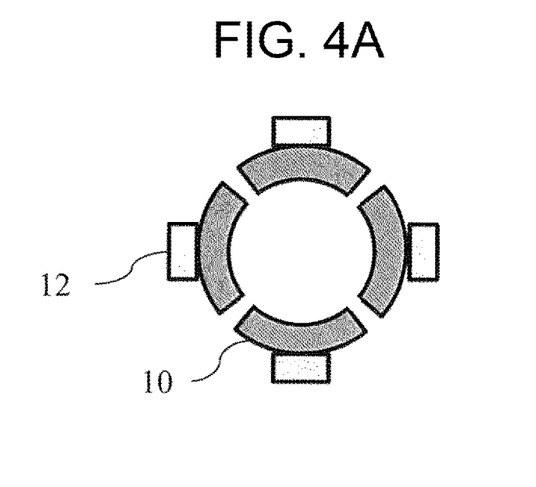
FIGS. 4A and 4B are bottom views showing a configuration of the signal detection surface 10.
Figure 4B:
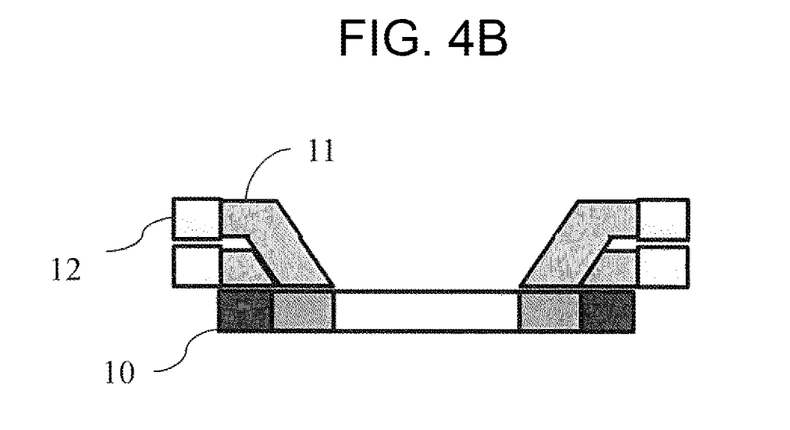

The signal detection surface 10 may be disposed perpendicular to the primary electron beam optical axis 3 as shown in FIG. 1, or may be disposed inclined as shown in FIG. 2, or may be disposed parallel to the primary electron beam optical axis 3 as shown in FIG. 3. The signal detection surface 10 may be a flat surface or a curved surface in each disposition method. In these, a method of detecting signal electrons and image generation are performed as described above. In addition, the signal detection surface 10 may be a configuration divided to a plurality of regions in a polygonal shape or fan shapes in an angular direction as shown in FIG. 4(*a*) and may also be a configuration divided as ring shapes having different diameters as shown in FIG. 4(*b*). Although four divisions are illustrated as an example in FIG. 4(*a*), the number of divisions is not limited in FIG. 4(*a*) and FIG. 4(*b*). In addition, although FIG. 4(*a*) shows a case where there is a space between small pieces of detection surfaces, a shape without the space is also possible. In the divided signal detection surfaces, an image having different contrasts such as a shadow image based on the emission angle of the signal electrons, can be acquired by calculating the electric signals obtained corresponding to the signal detection surfaces by a later-stage circuit. A method of connecting the small pieces of the signal detection surface 10 and the photoelectric conversion element 12 in FIG. 4(*a*) and FIG. 4(*b*) is an example, and in FIG. 4(*a*), a method of disposing the photoelectric conversion element in gaps of the small pieces of the signal detection surface 10 is considered.

In the above configuration, a deceleration (retarding) optical system for applying a negative voltage to the sample 8 and an acceleration (boosting) optical system for applying a positive voltage to the inner magnetic path 7 are effective for achieving high resolution and high efficiency of the reflected electron detection. In the retarding optical system, the primary electrons are decelerated by the negative voltage applied to the sample just before the primary electrons are incident onto the sample, and the incident angle of the converged primary electron beams increases, and thus an aberration is reduced. On the other hand, the retarding optical system serves as an accelerating electric field for the signal electrons, low-energy secondary electrons fly along the primary electron beam optical axis 3 due to a retarding electric field, and at the same time, high-energy reflected electrons are barely influenced and fly in various directions within the electron microscope column 1. Therefore, separate detection of the secondary electrons and the reflected electrons by the retarding electric field can be performed, and the reflected electrons can be detected without being buried in the secondary electrons with high generation efficiency.

In addition, in the boosting optical system, by temporarily increasing the energy of the primary electrons when the primary electrons are incident onto the objective lens, the ratio of an energy fluctuation in the primary electron beams can be reduced, and the aberration caused by the objective lens can be prevented. At the same time, since the boosting optical system serves as a pull-up field for signal electrons from the sample, the signal electrons that have collided with the lower part of the outer magnetic path 6 are pulled up to the inside of the inner magnetic path 7, so that a wider angle range of the reflected electrons can be detected, and high efficiency can be achieved.

Figure 9:
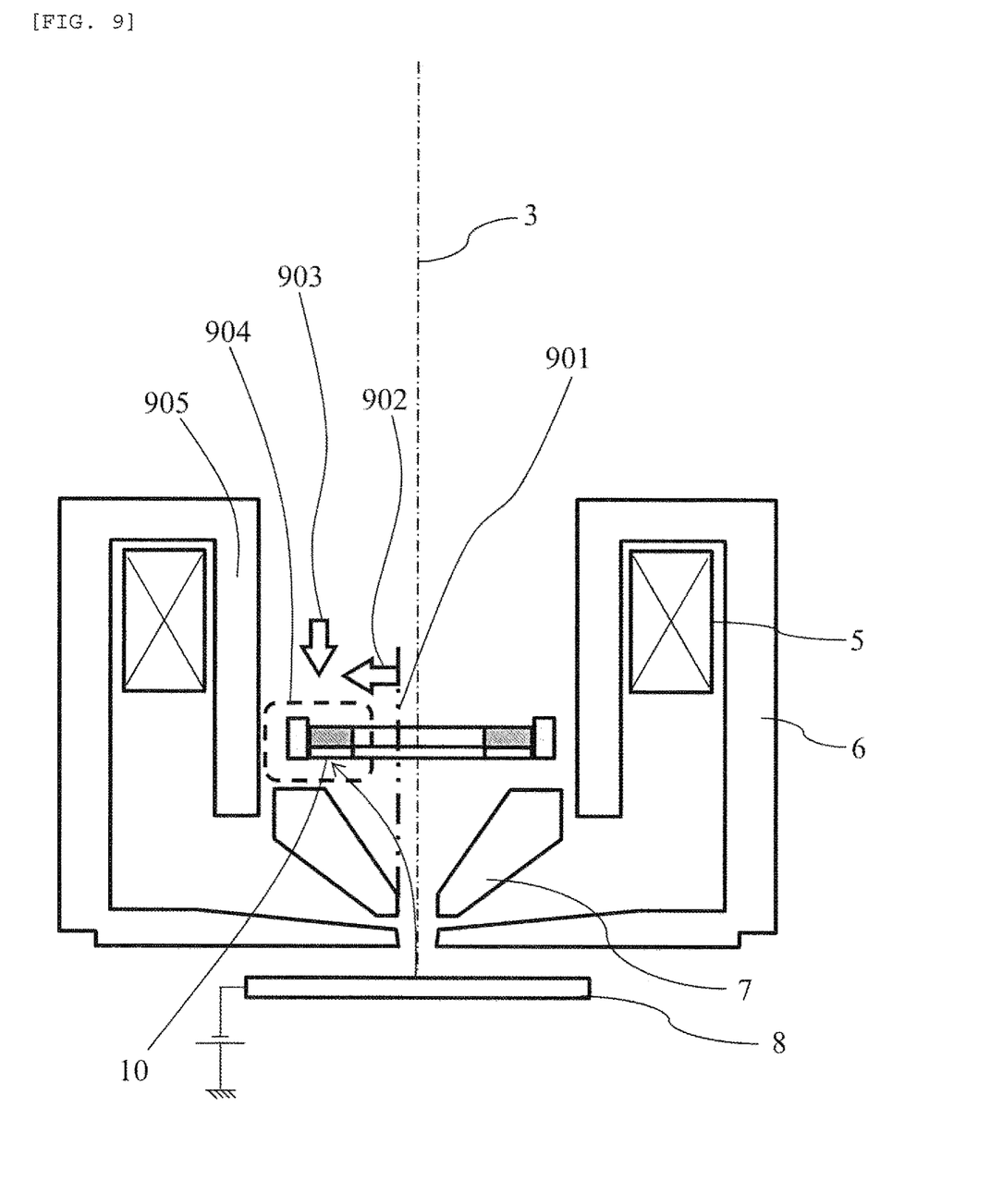
FIG. 9 is a diagram showing a shape of an objective lens and a disposing condition of a detector for the scanning electron microscope.

Next, the more specific operation and effect of the present embodiment will be described with reference to the drawings. FIG. 9 is a diagram showing a shape of the objective lens and a disposing condition of the detector for the scanning electron microscope illustrated in FIG. 1. As illustrated in FIG. 9, the inner magnetic path of the objective lens includes the inner magnetic path 7 (second inner magnetic path) including the leading end part of the magnetic path and a first inner magnetic path 905 forming an inner magnetic path other than the above. An inner wall surface (surface forming a beam passing tube) of the first inner magnetic path 905 is formed to face the primary electron beam optical axis 3.

The second inner magnetic path is formed so as to be long in a direction inclined with respect to the primary electron beam optical axis 3 and inclined to the primary electron beam optical axis 3. In addition, when expressed in a cross-sectional view as in FIG. 9, the second inner magnetic path is formed to be inclined with respect to a direction as a magnetic flux passing direction of the first inner magnetic path 905. Further, a constituent member of the detector is disposed to pass through the leading end of the inner magnetic path and to position the signal detection surface 10 on an outer side of a virtual straight line 901 defined in a direction parallel to the primary electron beam optical axis 3 (first inner magnetic path 905 side). The virtual straight line 901 is defined along a surface (a surface closest to the primary electron beam optical axis 3) facing the primary electron beam optical axis 3 of the inner magnetic path 7. In addition, the inner diameter (beam passing opening diameter) of the signal detection surface 10 is formed to be larger than the inner diameter of the inner magnetic path 7.

According to such a configuration, it is possible to detect the reflected electrons emitted at low angles and the reflected electrons emitted at medium angles with high efficiency. By using the objective lens structure and the disposing condition of the detector as described above in combination, the detection surface can be widened in a direction of the arrow 902, and the position of the detection surface can be lowered in a direction of the arrow 903 (sample direction), as compared with a case where the configuration is not adopted. In other words, by adopting the objective lens structure as described above, a space 904 can be provided in an electron beam path of the objective lens, and by positioning the signal detection surface 10 in such a space 904, the detection surface can be positioned on the trajectories of the reflected electrons emitted particularly at low angles and reflected electrons emitted at medium angles. As a result, it is possible to generate an image in which unevenness information of the sample surface is expressed at a high level.

In order to detect electrons emitted in a wide angle range, it is necessary not only to enlarge the detection surface, but also to set the detection surface close to the sample. This is because, even for detection surfaces having the same size, the angle range in which the detection surface can be covered is larger when the detection surface is closer to the sample (electron beam irradiation position). According to the configuration shown in FIG. 9, the extension of the detection surface in the direction of the arrow 902 and the expansion of a coverable emission angle range can be achieved together, and as a result, the above-described effects can be realized. In addition, since the detection surface can be extended in a direction away from the primary electron beam optical axis 3 instead of simply enlarging the detection surface, it is possible to detect reflected electrons emitted particularly in a medium-angle direction, which is lost previously, and to generate an image reflecting the unevenness state of the sample at a higher level.

Second Embodiment

Figure 5:
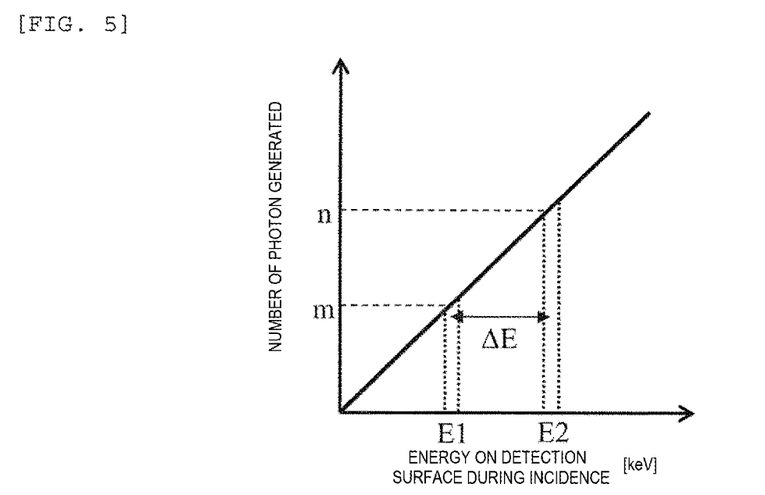
FIG. 5 is a graph showing a relationship between the number of photons generated in a scintillator and the electron incident energy.

The present embodiment will be described with reference to FIG. 5, FIG. 6, FIG. 7, FIG. 10, and FIG. 11. In the present embodiment, a configuration example for performing energy discrimination using the signal detection surface 10, the photoelectric conversion element 12, and the signal processing circuit 14 in the first embodiment for detecting low-angle and medium-angle reflected electrons will be described. When the signal detection surface 10 is configured by a scintillator, the number of photons generated changes according to the energy of the signal electrons 9 incident onto the signal detection surface 10 as shown in FIG. 5. The scintillator is a first conversion element that is configured to convert a reflected electron signal into light.

Figure 6:
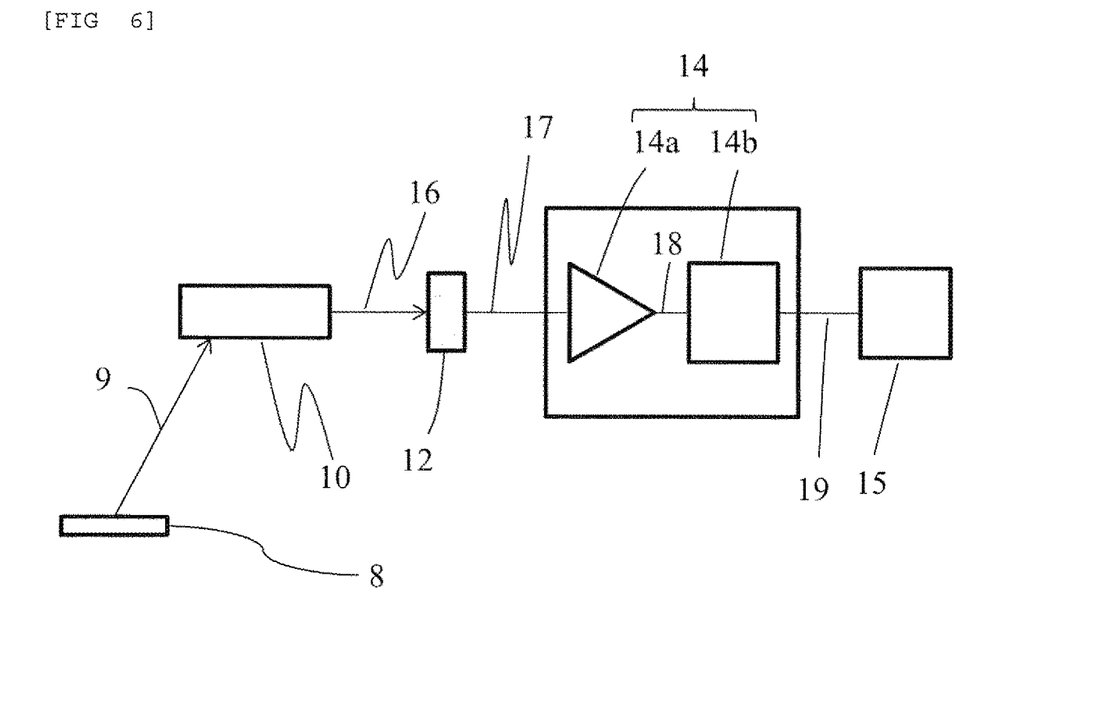
FIG. 6 is a diagram showing a flow of signal processing of signal electrons.

Using this property, an electric signal is converted by the photoelectric conversion element 12 according to the number of photons generated in the scintillator, and an output value of the electric signal is read by the arithmetic circuit 14*b*, so as to perform the energy discrimination. FIG. 6 is a schematic diagram from signal electron detection to image generation. When the signal electrons 9 generated from the sample 8 collide with the signal detection surface 10, photons with a number corresponding to the energy of the signal electrons 9 are emitted. Emitted photons 16 are guided to a light guide (not shown) and converted into an output electric signal 17 according to the number of photons by the photoelectric conversion element 12, and the output electric signal 17 is amplified by the amplification circuit 14*a* and becomes an amplified output electric signal 18. The electric signal is extracted according to a threshold value of the output set by the arithmetic circuit 14*b*, an image gradation value is generated at a frequency per unit time of the extracted electric signal 19, and the image gradation value is transmitted to the monitor 15 to generate an image in the case of energy discrimination.

Figure 7:
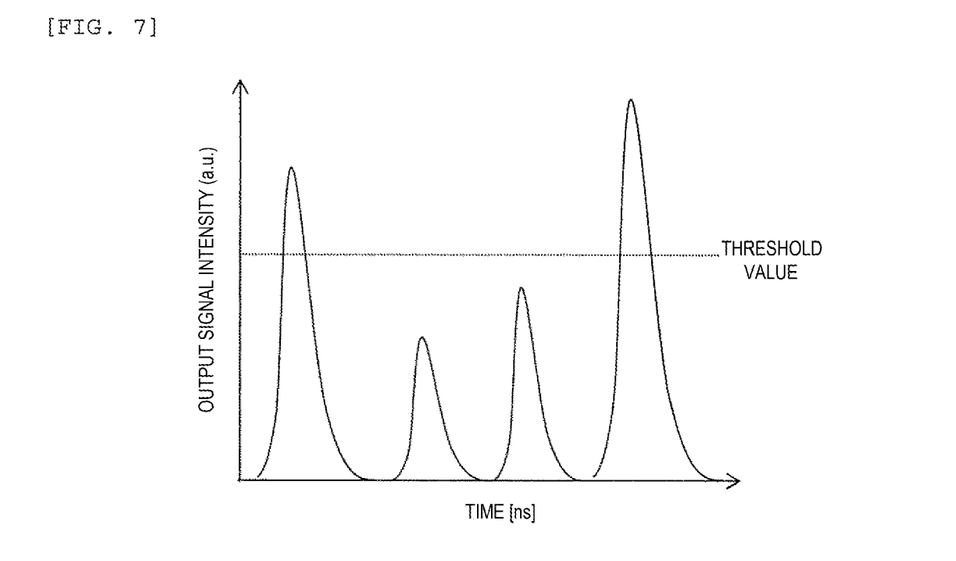
FIG. 7 is a graph showing a relationship between the intensity of an output electric signal and the time.

FIG. 7 is a diagram showing a relationship between the intensity of the amplified output electric signal 18 and the time. Although the amplified output electric signal 18 is generated as a pulse having various output values, the energy discrimination is performed by selecting and extracting a signal having an output higher than the threshold value set by the arithmetic circuit 14*b* or a signal having an output low than the threshold value among the output signals. With the energy discrimination, the observation part can be partially emphasized, and various measurements are achieved.

Figure 10:
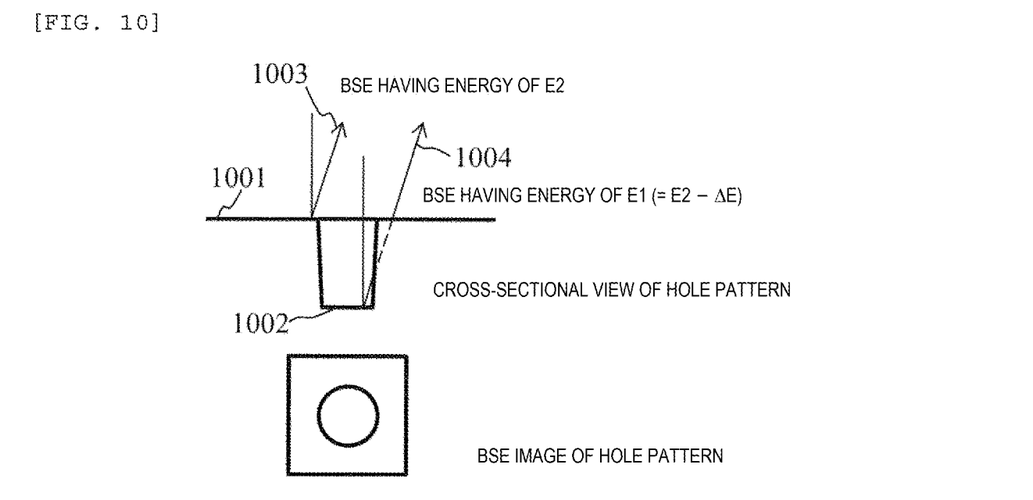
FIG. 10 is a diagram showing an example in which energy of reflected electrons changes according to an irradiation position of beams.

As illustrated in FIG. 10, even when electrons having an energy of E2 are reflected respectively from a surface 1001 and a bottom surface 1002 of a hole pattern when irradiation is performed with beams under the same condition, the energy of reflected electrons 1004 reflected by the bottom surface 1002 decreases (E1=E2−ΔE) as compared with reflected electrons 1003 emitted from the surface 1001 as penetrating a part of the sample. Further, since a conversion element (second conversion element) such as Si-PM can generate an electric signal corresponding to the number of photons reflecting the energy information, it is possible to generate an image in which a specific part of the pattern is emphasized by performing discrimination (classification) of the electric signals.

Figure 11:
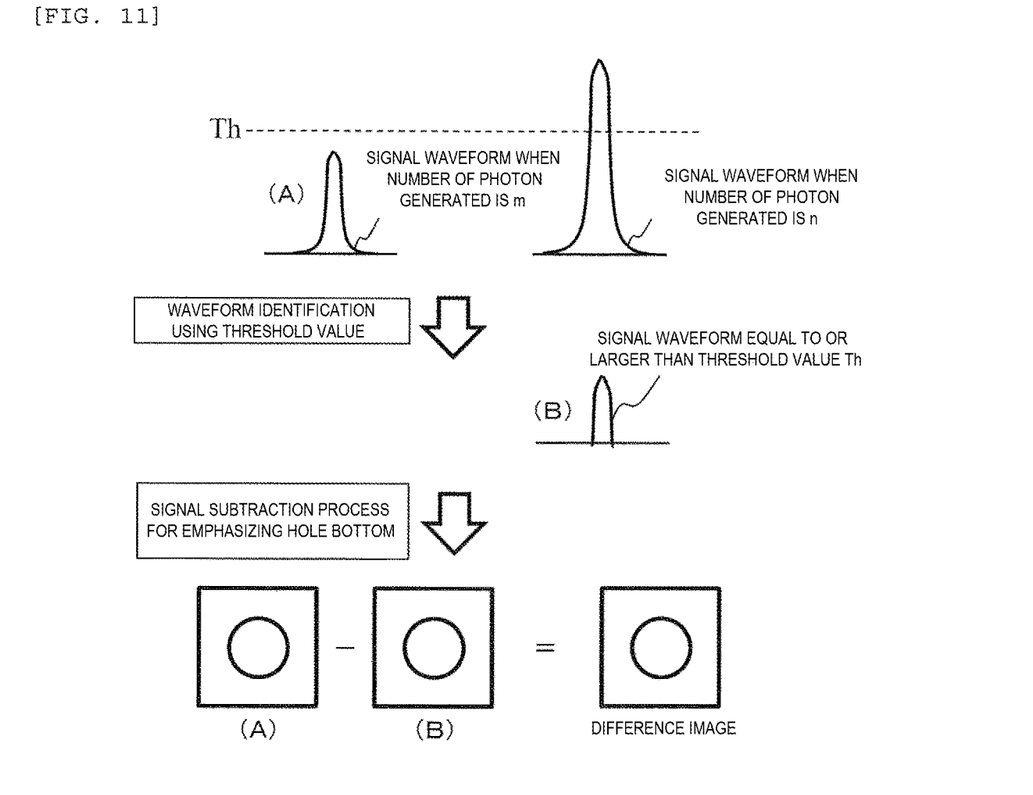
FIG. 11 is a diagram showing an image processing step of emphasizing detection signal information of a desired energy based on energy discrimination of the detection signal.

FIG. 11 is a diagram showing the principle. As described with reference to FIG. 5 and FIG. 10, in a case where the number of the photons is n when the energy of the reflected electrons is E2, and the number of the photons is m when the energy is E1, both the energies are identified by a predetermined threshold value (Th). As illustrated in FIG. 11, by extracting a signal equal to or larger than a predetermined threshold value, a region where the energy of the reflected electrons is E2 in a field of view can be selectively extracted. Most of the reflected electrons having an energy of E2 are emitted from the sample surface 1001, and information of the sample surface 1001 is strongly reflected by an image generated based on the detection of the reflected electrons having an energy of E2.

A signal waveform (B) excluding the reflected electron signal having other energy becomes an image particularly strongly reflecting the sample surface information. On the other hand, since the image generated based on the detection of the reflected electrons having an energy of E1 strongly reflects the information of the bottom surface 1002, it is possible to generate an image emphasizing the bottom surface 1002 by subtracting the signal (B) indicating the sample surface from a signal (A) strongly reflecting the information of the bottom surface 1002.

FIG. 11 describes an example in which two signals are discriminated by a single threshold value (Th); however, for example, when a stereoscopic structure including patterns of at least three different heights of an upper layer, a middle layer, and a lower layer is to be evaluated, as the pattern becomes deeper, the attenuation degree of the energy of the reflected electrons is considered to be large, so that a first threshold value (Th1) for discriminating the upper layer and the middle layer and a second threshold value (Th2) for discriminating the middle layer and the lower layer are provided; therefore, a subtraction process may be performed to extract a layer that is particularly desired to be emphasized. In addition, in the example of FIG. 11, an example is described in which an image emphasizing a signal on an upper layer side is generated by excluding a signal equal to or smaller than the threshold value (Th); however, a process of emphasizing information on a relatively lower layer side may be performed by excluding a signal larger than the threshold value (Th).

By performing the processing as described above by the arithmetic circuit 14b (processor), it is possible to perform energy discrimination by calculation without using an optical unit disposed in a vacuum region such as an energy filter or a spectrometer.

Although description is made only with respect to levels of energy in the present embodiment, it is also possible to extract an electric signal having an output value in a certain region, and a high pass, a low pass, and a band pass with respect to the energy of the reflected electron can also be described.

There is also a plurality of methods regarding a method of setting an energy region that is desired to be acquired. For example, a region of signal electron energy that is desired to be acquired in advance is selected, and only an electric signal having an output value within the range is counted and displayed on the monitor. In addition, all the output values are recorded for each pixel, and an energy region is selected after the primary electron scanning ends, and an image is generated from an electric signal having an output value within the range.

It is desirable that the photoelectric conversion element 12 is a photodiode (PD (particularly, avalanche photodiode: APD)) or Si-PM (silicon photomultiplier) that is a semiconductor element with a small fano factor. These elements have small output variations, and the number of incident photons can be reflected in the output value of the electric signal. On the other hand, a photomultiplier tube (PMT) of the photoelectric conversion element 12, which is generally used in an electron microscope, has a large output variation and generates an electric signal having an output value independent of the number of incident photons, which is thus not desirable.

When configured by these elements, energy discrimination can be performed without using another unit such as an energy filter or a spectroscope, and thus it has the advantage of being easy to configure as compared with other energy discriminable detectors.

Third Embodiment

Figure 8:
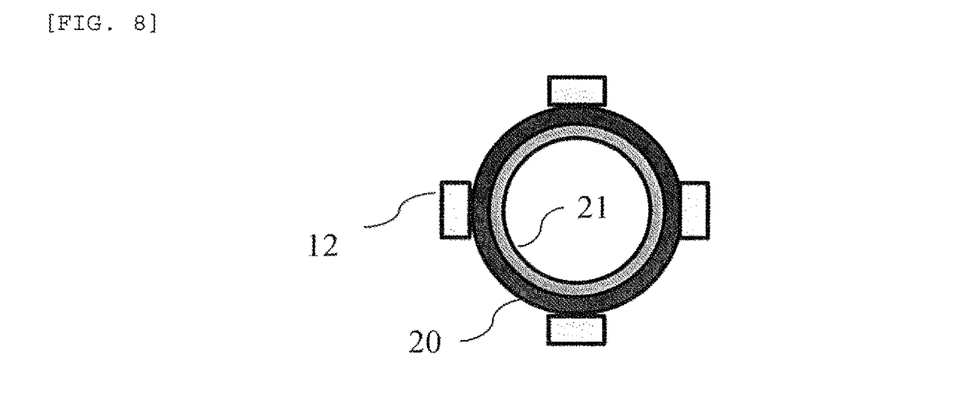
FIG. 8 is a diagram showing an example of the signal detection surface 10 having two types of detection surfaces.

The present embodiment will be described with reference to FIG. 8. FIG. 8 shows a bottom view of the detection surface including scintillators with different diameters of the signal detection surface 10. The signal detection surface 10 is configured by several scintillators with different emission wavelengths and emission amounts with rings (20, 21) having different diameters. The number of divisions may be three or more within a range of effects. When the photoelectric conversion element 12 is used to perform spectroscopy or photon counting, emission angle discrimination is enabled from the detection surface position corresponding to the detected wavelength and signal amount.

In the first embodiment, a configuration example is shown in which the photoelectric conversion element 12 is placed corresponding to each signal detection surface 10 divided into ring shapes; however, in the present embodiment, emission angle discrimination is performed by changing light emission characteristics of the scintillator configuring each divided signal detection surface 10.

REFERENCE SIGN LIST

1: electron microscope column
2: electron source
3: primary electron beam optical axis
4: deflector
5: coil
6: outer magnetic path
7: inner magnetic path
8: sample
9: signal electron
10: signal detection surface
11: light guide
12: photoelectric conversion element
13: output cable
14: signal processing circuit
14a: amplification circuit
14b: arithmetic circuit
15: monitor
16: emitted photon
17: output electric signal
18: amplified output electric signal
19: extracted electric signal
20: outer ring-shaped signal detection surface
21: inner ring-shaped signal detection surface

The invention claimed is:
1. A charged particle beam apparatus, comprising:
an objective lens that is configured to converge charged particle beams emitted from a charged particle source; and
a detector that is configured to detect backscattered electrons emitted from a sample; and
a deflector that is configured to deflect the charged particle beams, wherein
the objective lens includes an inner magnetic path and an outer magnetic path that are formed so as to enclose a coil, the inner magnetic path includes a first inner magnetic path that is disposed at a position outside of an optical axis of the charged particle beams, and a second inner magnetic path that is formed at a slant with respect to the optical axis of the charged particle beams and includes a leading end of the inner magnetic path, and a detection surface of the detector is disposed outside of a virtual straight line that passes through the leading end of the inner magnetic path and is parallel to the optical axis of the charged particle beams,
the detection surface is in a disk shape that includes an opening where the charged particle beams pass, and a side surface of the disk is provided with a conversion element that is configured to convert light obtained by the detection of the backscattered electrons on the detection surface into an electric signal, and the detection surface and the conversion element are disposed between the virtual straight line and the first inner magnetic path, and wherein a diameter of the opening of the detection surface is in a size equal to or larger than an inner diameter of the deflector.

2. A charged particle beam apparatus, comprising:

an objective lens that is configured to converge charged particle beams emitted from a charged particle source; and a detector that is configured to detect backscattered electrons emitted from a sample, wherein the objective lens includes an inner magnetic path and an outer magnetic path that are formed so as to enclose a coil, the inner magnetic path includes a first inner magnetic path that is disposed at a position outside of an optical axis of the charged particle beams, and a second inner magnetic path that is formed at a slant with respect to the optical axis of the charged particle beams and includes a leading end of the inner magnetic path, and a detection surface of the detector is disposed outside of a virtual straight line that passes through the leading end of the inner magnetic path and is parallel to the optical axis of the charged particle beams, the detection surface is in a disk shape that includes an opening where the charged particle beams pass, and a side surface of the disk is provided with a conversion element that is configured to convert light obtained by the detection of the backscattered electrons on the detection surface into an electric signal, the detection surface and the conversion element are disposed between the virtual straight line and the first inner magnetic path, and a diameter of the opening of the detection surface is larger than an inner diameter of the leading end of the magnetic path.

3. The charged particle beam apparatus according to claim 2, wherein the detection surface and the conversion element are disposed on a charged particle source side from the second inner magnetic path.

4. The charged particle beam apparatus according to claim 2, wherein the detection surface and the conversion element are formed in a space located closer to the sample than an upper end of the first inner magnetic path.

5. The charged particle beam apparatus according to claim 2, further comprising:

a deflector that is configured to deflect the charged particle beams, wherein the detection surface is disposed closer to a sample side than the deflector.

6. The charged particle beam apparatus according to claim 2, wherein the sample is applied with a negative voltage to decelerate the charged particle beam.

7. The charged particle beam apparatus according to claim 2, wherein a positive voltage for accelerating the charged particle beams is applied to the second inner magnetic path.

8. The charged particle beam apparatus according to claim 2, wherein the detection surface is a scintillator, and includes an output cable that is configured to transmit an electric signal output from the conversion element to an outside of a vacuum space.

9. The charged particle beam apparatus according to claim 2, wherein the detection surface is divided into a plurality of regions.

10. The charged particle beam apparatus according to claim 9, wherein the plurality of regions are divided in an angular direction.

11. The charged particle beam apparatus according to claim 9, wherein the plurality of regions are divided in a radial direction.

12. The charged particle beam apparatus according to claim 9, wherein the plurality of regions are divided in both an angle direction and a radial direction.

13. The charged particle beam apparatus according to claim 2, further comprising:

an arithmetic processing unit that is configured to generate an image based on a classification according to energies of the detected charged particles output from the detector.

14. The charged particle beam apparatus according to claim 13, wherein the detector includes a first conversion element that is configured to convert a detected signal into light, and the arithmetic processing unit performs the classification according to intensity of light output from the conversion element.

15. The charged particle beam apparatus according to claim 14, wherein the detector includes a second conversion element that is configured to convert an optical signal output from the conversion element into an electric signal, and the arithmetic processing unit performs the classification according to intensity of the electric signal.

16. The charged particle beam apparatus according to claim 15, wherein the second conversion element is a photodiode or a silicon photomultiplier.

* * * * *